(12) United States Patent
Liu et al.

(10) Patent No.: US 6,649,435 B2
(45) Date of Patent: Nov. 18, 2003

(54) PRECISION MICROMIRROR POSITIONING

(75) Inventors: Jwei Wien Liu, Plano, TX (US); Satyan R. Kalyandurg, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/039,350

(22) Filed: Dec. 31, 2001

(65) Prior Publication Data

US 2002/0086458 A1 Jul. 4, 2002

Related U.S. Application Data

(60) Provisional application No. 60/258,989, filed on Dec. 29, 2000.

(51) Int. Cl.⁷ .......................... H01L 21/00; H01L 21/44
(52) U.S. Cl. .............................. 438/26; 438/64; 438/51; 438/55; 438/115
(58) Field of Search .............................. 438/26, 64, 51, 438/55, 115; 359/838, 293, 245, 224; 356/498, 521; 385/521, 16–20

(56) References Cited

U.S. PATENT DOCUMENTS

| | | | |
|---|---|---|---|
| 5,293,511 A | * | 3/1994 | Poradish et al. ............ 257/434 |
| 6,005,649 A | * | 12/1999 | Krusius et al. ............... 349/73 |
| 6,031,656 A | * | 2/2000 | Little et al. .................. 359/293 |
| 6,031,657 A | * | 2/2000 | Robinson et al. ........... 359/293 |
| 6,412,972 B1 | * | 7/2002 | Pujol et al. .................. 362/272 |
| 2002/0056900 A1 | * | 5/2002 | Liu et al. | |

* cited by examiner

*Primary Examiner*—Caridad Everhart
*Assistant Examiner*—Igwe U. Anya
(74) *Attorney, Agent, or Firm*—Charles A. Brill; Wade James Brady III; Frederick J. Telecky, Jr.

(57) ABSTRACT

A system and method of aligning a micromirror array to the micromirror package and the micromirror package to a display system. The system and method improve the alignment of the micromirror array to the display system by using a consistent set of precision reference regions. The micromirror package substrate 700 engages an alignment fixture portion of a die mounter 702 during the die mount operation, and a similar fixture when installed in a display system. The package substrate 700 is held by the predefined regions on two edges and the three predefined regions on the top surface. When mounting the device in the package optical techniques may be used for x-y plane alignment. Spring plunger 710 biases the substrate against the contact points 708 on the top surface. In the display system or other end equipment, a socket contacts the same six points to align the device. The preceding abstract is submitted with the understanding that it only will be used to assist in determining, from a cursory inspection, the nature and gist of the technical disclosure as described in 37 C.F.R. §1.72(b). In no case should this abstract be used for interpreting the scope of any patent claims.

20 Claims, 2 Drawing Sheets

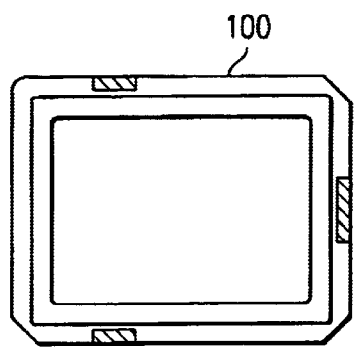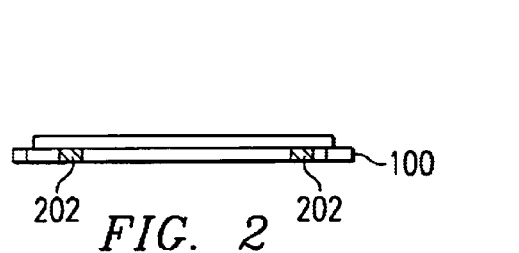
FIG. 1        FIG. 2        FIG. 3
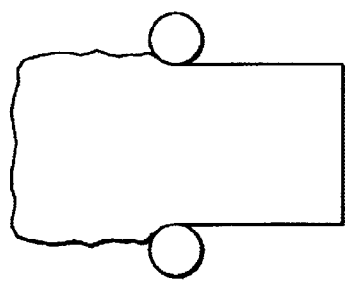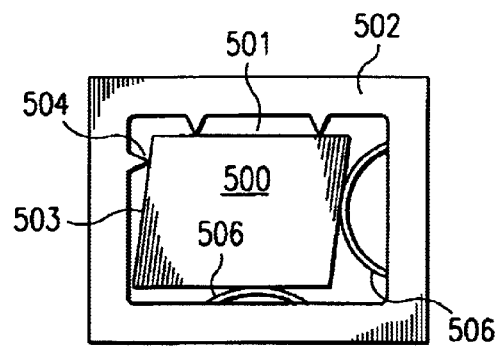
FIG. 4        FIG. 5
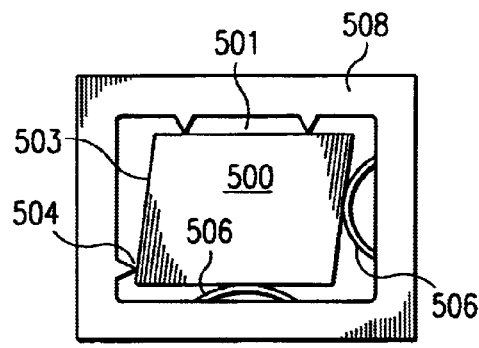
FIG. 6

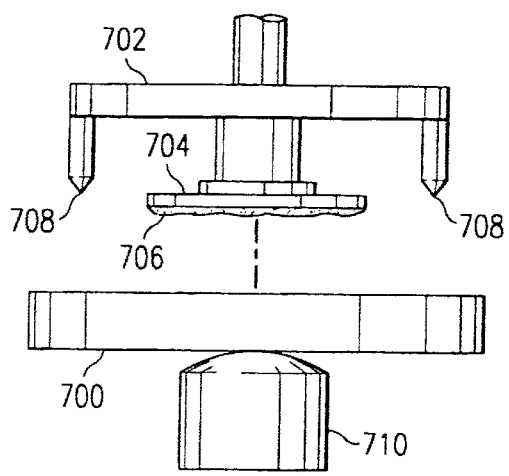
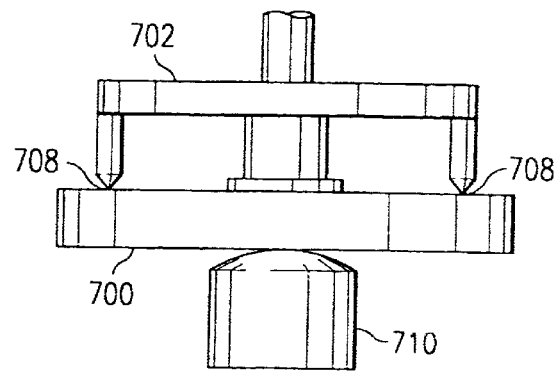
FIG. 7A          FIG. 7B
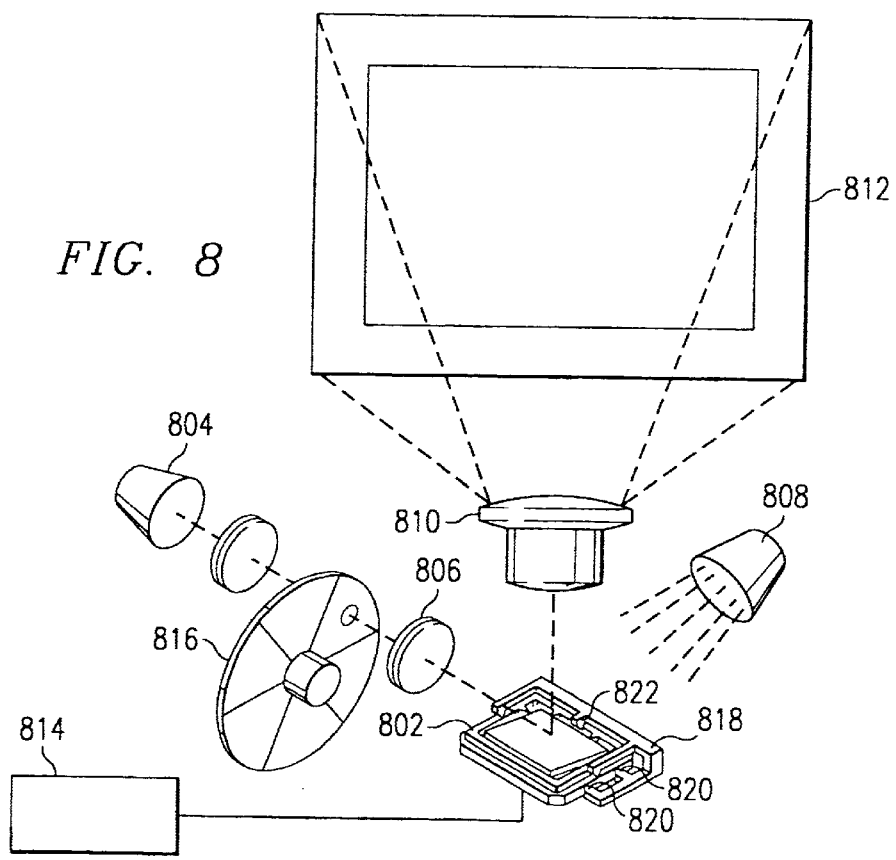
FIG. 8

PRECISION MICROMIRROR POSITIONING

This application claims priority under 35 use §119(e)(1) of provisional application No. 60/258,989 filed Dec. 29, 2000.

FIELD OF THE INVENTION

This invention relates to the field of micromirror manufacturing systems, more particularly to alignment of micromirrors and micromirror packages.

BACKGROUND OF THE INVENTION

Micromechanical devices are small structures typically fabricated on a semiconductor wafer using techniques such as optical lithography, doping, metal sputtering, oxide deposition, and plasma etching which have been developed for the fabrication of integrated circuits.

Micromirrors are a type of micromechanical device. Other types of micromechanical devices include accelerometers, pressure and flow sensors, gears and motors. While some micromechanical devices, such as pressure sensors, flow sensors, and micromirrors have found commercial success, other types have not yet been commercially viable.

Micromirrors are primarily used in optical display systems. In display systems, the micromirror is a light modulator that uses digital image data to modulate a beam of light by selectively reflecting portions of the beam of light to a display screen. While analog modes of operation are possible, commercially feasible micromirrors typically operate in a digital bistable mode of operation and as such are the core of the first true digital full-color image projection systems.

Micromirrors have evolved rapidly over the past ten to fifteen years. Early devices used a deformable reflective membrane which, when electrostatically attracted to an underlying address electrode, dimpled toward the address electrode. Schlieren optics illuminate the membrane and create an image from the light scattered by the dimpled portions of the membrane. Schlieren systems enabled the membrane devices to form images, but the images formed were very dim and had low contrast ratios, making them unsuitable for most image display applications.

Later micromirror devices used flaps or diving board-shaped cantilever beams of silicon or aluminum, coupled with dark-field optics to create images having improved contrast ratios. Flap and cantilever beam devices typically used a single metal layer to form the top reflective layer of the device. This single metal layer tended to deform over a large region, however, which scattered light impinging on the deformed portion. Torsion beam devices use a thin metal layer to form a torsion beam, which is referred to as a hinge, and a thicker metal layer to form a rigid member, or beam, typically having a mirror-like surface: concentrating the deformation on a relatively small portion of the micromirror surface. The rigid mirror remains flat while the hinges deform, minimizing the amount of light scattered by the device and improving the contrast ratio of the device.

Recent micromirror configurations, called hidden-hinge designs, further improve the image contrast ratio by fabricating the mirror on a pedestal above the torsion beams. The elevated mirror covers the torsion beams, torsion beam supports, and a rigid yoke connecting the torsion beams and mirror support, further improving the contrast ratio of images produced by the device.

Micromirror arrays used in display systems are small compared to most other technologies. The small array size makes the alignment of the array critical to the performance of the device. A misalignment of only 100 $\mu$m shifts the image more than eight image pixels. While this misalignment requires larger, more expensive optics in sequential color systems that use a single micromirror, misalignment can complicate the convergence operation in the larger three-micromirror display systems. The micromirror package are used to align the micromirror array to the display system optics. Not only must the micromirror be precisely aligned relative to the package, the plane of the micromirror must be aligned with the plane of the projection lens to achieve proper focus across the entire micromirror array. What is needed is a method and system of ensuring precise alignment of the micromirror array within a micromirror package.

SUMMARY OF THE INVENTION

Objects and advantages will be obvious, and will in part appear hereinafter and will be accomplished by the present invention which provides a method and system for precision micromirror positioning. One embodiment of the claimed invention provides a method of mounting a micromirror array on a package substrate, the method comprises: providing a package substrate, the package substrate having at least two edges and one surface; aligning the package substrate along an y axis by contacting the package substrate in two predefined regions along a first edge; aligning the package substrate along an x axis by contacting the package substrate in one predefined region along a second edge; aligning the package substrate along a z axis by contacting the package substrate in three predefined regions along a first surface, said x, y, and z axes being orthogonal and the first surface being parallel to the x and y axes; and attaching a micromirror at a predetermined position on the package substrate.

Another embodiment of the present invention provides a method of aligning a micromirror array to a display system. The method comprises: providing a package substrate, the package substrate having at least two edges and one surface; aligning the package substrate along an y axis by contacting the package substrate in two predefined regions along a first edge; aligning the package substrate along an x axis by contacting the package substrate in one predefined region along a second edge; aligning the package substrate along a z axis by contacting the package substrate in three predefined regions along a first surface, said x, y, and z axes being orthogonal and the first surface being parallel to said x and y axes; attaching a micromirror at a predetermined position on the package substrate; attaching a cover to the package substrate to enclose the micromirror; providing a display system having a socket to hold the micromirror; and placing the package substrate in the socket such that the socket aligns the package substrate by contacting the package substrate in the two predefined regions along the first edge, the one predefined region along the second edge, and the three predefined regions along the first surface.

Another embodiment of the disclosed invention provides a method of mounting a micromirror array on a package substrate. The method comprising: providing a package substrate, the package substrate having at least two edges and one surface; aligning the package substrate along an y axis by contacting the package substrate in two predefined regions along a first edge; aligning the package substrate along an x axis by contacting the package substrate in one predefined region along a second edge; and attaching a micromirror at a predetermined position on the package substrate.

Another embodiment of the present invention provides a method of aligning a micromirror array to a display system. The method comprising: providing a package substrate, the package substrate having at least two edges and one surface; aligning the package substrate along an y axis by contacting the package substrate in two predefined regions along a first edge; aligning the package substrate along an x axis by contacting the package substrate in one predefined region along a second edge; attaching a micromirror at a predetermined position on the package substrate; attaching a cover to the package substrate to enclose the micromirror; providing a display system having a socket to hold the micromirror; and placing the package substrate in the socket such that the socket aligns the package substrate by contacting the package substrate in the two predefined regions along the first edge, the one predefined region along the second edge, and the three predefined regions along the first surface.

Another embodiment of the disclosed invention provides a method of mounting a micromirror array in a display system. The method comprising: providing a micromirror array in a package, the package having at least two edges and one surface; aligning the package along an y axis by contacting the package substrate in two predefined regions along a first edge; and aligning the package along an x axis by contacting the package in one predefined region along a second edge.

Another embodiment of the disclosed invention provides a method of aligning a micromirror array to a display system. The method comprising: providing a micromirror package, the package having at least two edges and one surface; aligning the package along an y axis by contacting the package in two predefined regions along a first edge; aligning the package along an x axis by contacting the package in one predefined region along a second edge; and aligning the package along a z axis by contacting the package in three predefined regions along a first surface, the x, y, and z axes being orthogonal and the first surface being parallel to the x and y axes.

BRIEF DESCRIPTION OF THE DRAWINGS

For a more complete understanding of the present invention, and the advantages thereof, reference is now made to the following descriptions taken in conjunction with the accompanying drawings, in which:

FIG. 1 is a top view of a micromirror package substrate.

FIG. 2 is a first side view of the micromirror package substrate of FIG. 1.

FIG. 3 is a second side view of the micromirror package substrate of FIGS. 1 and 2.

FIG. 4 shows the package substrate of FIGS. 1–3 being ground on an opposing first and third side.

FIG. 5 is a plan view of a package substrate held in a socket that aligns the package substrate.

FIG. 6 is a plan view of the package substrate of FIG. 5 held in a socket that aligns the package substrate showing the effects of non-standardized reference regions.

FIG. 7A is an idealized side view of the micromirror package substrate supported by a plunger as a die mounter with an alignment fixture approaches.

FIG. 7B is the idealized side view of the micromirror package substrate and die mounter of FIG. 7A showing the engagement between the device substrate and the alignment fixture.

FIG. 8 is a schematic view of a micromirror package held in alignment in a display system according to one embodiment of the present invention

DETAILED DESCRIPTION OF THE PREFERRED EMBODIMENTS

A method and system for precision micromirror package alignment has been developed. The new method and system provide improved alignment of the micromirror device to display system optics. The improved alignment is achieved by defining and preparing reference points on the package substrate. The reference points are used both to position the micromirror array relative to the package substrate and to position the package substrate relative to the display system. Defining regions on the edges and surface of the package substrate improves alignment of the micromirror by limiting the tolerance build up that previously occurred when an entire edge was used as a reference. Defining regions on the top surface of the package substrate to align the micromirror to in the z-direction improves the alignment of the micromirror device in the display system over previous methods which used the entire bottom surface of the substrate as a reference plane when attaching the micromirror device.

FIG. 1 is a top view of a micromirror package substrate 100. FIGS. 2 and 3 are side views of the micromirror package substrate. In FIG. 1, the substrate 100 has a surface region 102 on which the micromirror device will be attached. Before the device is attached, however, the substrate is aligned in a known and repeatable position.

When the package substrate is manufactured, the edges are ground in a standard grinding process to provide reasonably smooth and flat surfaces. FIG. 4 shows the package substrate being ground on an opposing first and third side. The first side will be used as a reference for aligning the device to the optical display system. After the first and third sides are ground, the second and fourth sides are ground. Unfortunately, the grinding process, while producing straight and uniform edges, does not ensure the third and fourth edges are perpendicular to the first and second edges. Because these edges are not perpendicular, the alignment of the device in a plane parallel to the plane of FIG. 1 is determined by what points on the first and second edges are contacted by an alignment socket.

FIGS. 5 and 6 illustrate this problem. In FIGS. 5 and 6 the angle between adjacent edges of the package substrate is greatly exaggerated. In FIG. 5, a package substrate 500 is held in a socket 502 that contacts the second edge 503 of the package substrate at a point 504 near the first edge 501 of the package substrate 500. The package substrate is held against the contact points by spring members 506.

In FIG. 6, the package substrate is held in a socket 508 that contacts the second edge 503 of the package substrate at a point 510 far from the first edge 501 of the package substrate 500. Because the edges of the package in FIGS. 5 and 6 are not square, the micromirror device and package substrate of FIG. 6 are shifted to the right of the figure. As described above, this misalignment can make it difficult to position the micromirror of FIGS. 5 and 6 relative to the remainder of display optics in a consistent and reliable manner.

A solution to the problem illustrated by FIGS. 5 and 6 is to define reference regions on the edges of the package an limit contact with the package to those regions. Returning to FIG. 2, there are shown two regions 202 on the first edge of the package substrate 100. The smaller the region, the less the region's surface will deviate over the extent of the region, but the more difficult it is to align with the region. Typically, each of these regions are approximately 0.1 inches across.

Another region is defined on the second edge of the package substrate. The region on the second edge typically is centered on the second edge and also is approximately 0.1 inches across. All of these dimensions may vary a great deal and are provided only for purposes of illustration.

The edge alignment systems have greatly improved the alignment of micromirror devices. Achieving alignment across an image plane, however, has proven to be a more difficult problem. Prior art alignment systems attached the micromirror array to the substrate while pressing the back of the package substrate against a reference plane. To avoid the effects of cupping and twisting, the prior art systems typically used a reference plane positioned in the middle of the back of the substrate-directly opposite the region on which the micromirror device was attached. This region was considered the most reliable region to use as a reference plane since the center portion of the substrate was less susceptible to cupping and was positioned closely to the micromirror.

After attaching the micromirror, and completing the package—typically by attaching a transparent glass lid or cover—the packaged micromirror was installed in a display system. The micromirror was aligned to the display system by pressing the front surface of the package against a display system reference plane. Since the micromirror was packages using the back of the package as a reference, and installed in the display system using the front surface of the package, any lack of parallelism between the front and back surfaces of the micromirror package results in an alignment error in the display system.

A solution to the alignment problem is to define three points on the surface of the package substrate to use as a reference both when the micromirror is packaged and when the micromirror is installed in a display system. Three sample regions are shown in FIG. 1. Each region 104 provides a relatively small target for the assembly and display system alignment fixtures. In FIG. 1, each region 104 is about 0.200 to 0.300 inches long, and about 0.060 inches wide. Application of a force from the back of the package forces these regions of the package against protrusions in an alignment fixture or display system holding the plane of the micromirror device in precise alignment with the alignment fixture or display system.

FIG. 7A is a idealized side view of the micromirror package substrate 700 supported by a plunger while a die mounter 702 approaches carrying a device 704 to be mounted in the package substrate 700. The die mounter 702 includes three precision reference points 708, only two of which are shown in FIG. 7A, to engage the top of the package substrate 700 at the predetermined reference positions. The plunger 710 provides pressure against the back of the package to hold the package substrate 700 against the precision reference points 708. While similar features could be used to provide horizontal alignment in the x-y plane, perpendicular to the plane of FIG. 7A, the die mounter typically uses optical alignment for the x-y plane. Optical alignment provides at least as good of alignment, while avoiding the generation of particles that occurs when the sides of the package are touched.

The device 704 is held in the die mounter and includes an adhesive layer 706 to attach the device to the package substrate. Alternatively, the adhesive layer 706 may be deposited in he package substrate. As the die mounter engages the reference points on the package substrate, the device is precisely positioned in the z-axis direction. FIG. 7B shows the die mounter 702 engaging the package substrate 700 and positioning the device inside the package substrate cavity.

FIG. 8 is a schematic view of a micromirror package held in alignment in a display system according to one embodiment of the present invention. In FIG. 8, light from light source 804 is focused on the improved micromirror 802 by lens 806. Although shown as a single lens, lens 806 is typically a group of lenses and mirrors which together focus and direct light from the light source 804 onto the surface of the micromirror device 802. As shown in FIG. 8, a color wheel 816, or another color splitting mechanism such as a color splitting prism is used to separate a beam of white light into separate primary colored light beams.

Micromirror array 802 is held in a socket 818. The socket 818 shown is for illustrative purposes only. The socket contacts the micromirror package at six points. Two contact points 820 on a first edge, one contact point on a second edge, and three contact points 822 on the top surface of the package. The micromirror array 802 is biased against these six points to ensure precise alignment of the micromirror array 802 with the socket 818. The socket 818 defines the reference plane around which the remainder of the display system is aligned.

Image data and control signals from controller 814 cause some mirrors in the array to rotate to an on position and others to rotate to an off position. Mirrors on the micromirror device that are rotated to an off position reflect light to a light trap 808 while mirrors rotated to an on position reflect light to projection lens 810, which is shown as a single lens for simplicity. Projection lens 810 focuses the light modulated by the micromirror device 802 onto an image plane or screen 812.

Thus, although there has been disclosed to this point a particular embodiment for precision micromirror positioning and method therefore, it is not intended that such specific references be considered as limitations upon the scope of this invention except insofar as set forth in the following claims. Furthermore, having described the invention in connection with certain specific embodiments thereof, it is to be understood that further modifications may now suggest themselves to those skilled in the art, it is intended to cover all such modifications as fall within the scope of the appended claims. In the following claims, only elements denoted by the words "means for" are intended to be interpreted as means plus function claims under 35 U.S.C. §112, paragraph six.

What is claimed is:

1. A method of mounting a micromirror array on a package substrate, the method comprising:

providing a package substrate, said package substrate having at least two edges and one surface;

aligning said package substrate along an y axis by contacting said package substrate in two predefined regions along a first edge;

aligning said package substrate along an x axis by contacting said package substrate in one predefined region along a second edge;

aligning said package substrate along a z axis by contacting said package substrate in three predefined regions along a first surface, said x, y, and z axes being orthogonal and said first surface being parallel to said x and y axes; and attaching a micromirror at a predetermined position on said package substrate.

2. The method of claim 1, wherein said attaching a micromirror at a predetermined position on said package substrate comprises:

attaching said micromirror on said first surface.

3. The method of claim 1, wherein said attaching a micromirror at a predetermined position on said package substrate comprises:

attaching said micromirror on said first surface in a region between said three predefined regions.

4. The method of claim 1, wherein said aligning said package substrate along a z axis by contacting said package substrate in three predefined regions along a first surface comprises:
aligning said package substrate along a z axis by contacting said package substrate in three predefined regions along a top surface.

5. The method of claim 1, further comprising:
grinding said three predefined regions of said package substrate.

6. A method of aligning a micromirror array to a display system, the method comprising:
providing a package substrate, said package substrate having at least two edges and one surface;
aligning said package substrate along an y axis by contacting said package substrate in two predefined regions along a first edge;
aligning said package substrate along an x axis by contacting said package substrate in one predefined region along a second edge;
aligning said package substrate along a z axis by contacting said package substrate in three predefined regions along a first surface, said x, y, and z axes being orthogonal and said first surface being parallel to said x and y axes;
attaching a micromirror at a predetermined position on said package substrate;
attaching a cover to said package substrate to enclose said micromirror;
providing a display system having a socket to hold said micromirror; and
placing said package substrate in said socket such that said socket aligns said package substrate by contacting said package substrate in said two predefined regions along said first edge, said one predefined region along said second edge, and three predefined regions along said first surface.

7. The method of claim 6, wherein said attaching a micromirror at a predetermined position on said package substrate comprises:
attaching said micromirror on said first surface.

8. The method of claim 6, wherein said attaching a micromirror at a predetermined position on said package substrate comprises:
attaching said micromirror on said first surface in a region between said three predefined regions.

9. The method of claim 6, wherein said aligning said package substrate along a z axis by contacting said package substrate in three predefined regions along a first surface comprises:
aligning said package substrate along a z axis by contacting said package substrate in three predefined regions along a top surface.

10. The method of claim 6, further comprising:
grinding said three predefined regions of said package substrate.

11. A method of mounting a micromirror array on a package substrate, the method comprising:
providing a package substrate, said package substrate having at least two edges and one surface;
aligning said package substrate along an y axis by contacting said package substrate in two predefined regions along a first edge;
aligning said package substrate along an x axis by contacting said package substrate in one predefined region along a second edge; and
attaching a micromirror at a predetermined position on said package substrate.

12. The method of claim 11, wherein said attaching a micromirror at a predetermined position on said package substrate comprises:
attaching said micromirror on said first surface.

13. The method of claim 11, further comprising:
grinding said at least two edges of said package substrate.

14. A method of aligning a micromirror array to a display system, the method comprising:
providing a package substrate, said package substrate having at least two edges and one surface;
aligning said package substrate along an y axis by contacting said package substrate in two predefined regions along a first edge;
aligning said package substrate along an x axis by contacting said package substrate in one predefined region along a second edge;
attaching a micromirror at a predetermined position on said package substrate;
attaching a cover to said package substrate to enclose said micromirror;
providing a display system having a socket to hold said micromirror; and
placing said package substrate in said socket such that said socket aligns said package substrate by contacting said package substrate in said two predefined regions along said first edge, said one predefined region along said second edge, and three predefined regions along said first surface.

15. The method of claim 14, wherein said attaching a micromirror at a predetermined position on said package substrate comprises:
attaching said micromirror on said first surface.

16. The method of claim 14, wherein sat placing said package substrate in said socket comprises:
aligning said package substrate along a z axis by contacting said package substrate in said three predefined regions along a top surface.

17. The method of claim 14, further comprising:
grinding said at least two edges of said package substrate.

18. A method of mounting a micromirror array in a display system, the method comprising:
providing a micromirror array in a package, said package having at least two edges and one surface;
aligning said package along an y axis by contacting said package substrate in two predefined regions along a first edge; and
aligning said package along an x axis by contacting said package in one predefined region along a second edge.

19. A method of aligning a micromirror array to a display system, the method comprising:
providing a micromirror package, said package having at least two edges and one surface;

aligning said package along an y axis by contacting said package in two predefined regions along a first edge;

aligning said package along an x axis by contacting said package in one predefined region along a second edge; and aligning said package along a z axis by contacting said package in three predefined regions along a first surface, said x, y, and z axes being orthogonal and said first surface being parallel to said x and y axes.

20. The method of claim 19, wherein said aligning said package substrate along a z axis by contacting said package substrate in three predefined regions along a first surface comprises:

aligning said package substrate along a z axis by contacting said package substrate in three predefined regions along a top surface.

* * * * *